(12) United States Patent
Wark

(10) Patent No.: US 6,200,144 B1
(45) Date of Patent: Mar. 13, 2001

(54) INTERPOSER/CONVERTER TO ALLOW SINGLE-SIDED CONTACT TO CIRCUIT MODULES

(75) Inventor: James M. Wark, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/414,203

(22) Filed: Oct. 7, 1999

Related U.S. Application Data

(62) Division of application No. 08/810,048, filed on Mar. 4, 1997, now Pat. No. 6,004,142.

(51) Int. Cl.$^7$ .................................................. H01R 12/00
(52) U.S. Cl. .............................. 439/74; 439/326; 439/637
(58) Field of Search ................................ 439/74, 75, 331, 439/326, 131, 637; 324/755, 757, 758

(56) References Cited

U.S. PATENT DOCUMENTS

| | | | |
|---|---|---|---|
| 3,701,071 | 10/1972 | Landman | 439/326 |
| 3,746,932 | 7/1973 | Hogan et al. | 439/637 |
| 4,718,859 | 1/1988 | Gardner | 439/635 |
| 5,256,078 | 10/1993 | Lwee et al. | 439/326 |
| 5,334,030 | 8/1994 | Brilliott | 439/75 |
| 5,337,220 | 8/1994 | Granitiz | 439/326 |
| 5,511,985 | 4/1996 | Noschese et al. | 439/157 |
| 5,514,002 | 5/1996 | Cheng et al. | 439/637 |
| 5,525,812 | 6/1996 | Bandzuch et al. | 257/48 |
| 5,657,081 | 8/1997 | Kurahashi | 439/331 |
| 5,690,502 | 11/1997 | Mochizuki | 439/326 |
| 5,695,354 | 12/1997 | Noda | 439/326 |
| 5,697,802 | 12/1997 | Kawabe | 439/326 |
| 5,779,494 | 7/1998 | Ito et al. | 439/328 |

FOREIGN PATENT DOCUMENTS 60-173790   7/1985   (JP) ..................................... 439/326

*Primary Examiner*—Paula Bradley
*Assistant Examiner*—Tho D. Ta
(74) *Attorney, Agent, or Firm*—Trask Britt

(57) ABSTRACT

An apparatus and method for routing all external connection points of a double-sided edge connector of a circuit card to one side of a test tray suitable for testing with a bed of nails, "pogo pin" or similar type of load board for functional testing of said circuit card. A first embodiment of the apparatus includes a pivotally mounted or snap-in removable electrical and mechanical receptacle with a slot or socket suitable for holding a double-sided edge connector of a circuit card in a test tray. The receptacle pivots or is otherwise mounted in the test tray to allow the circuit card to lie co-planar with the test tray, thus providing perpendicular contact to the pins of a bed of nails load board. Another embodiment provides a fixed receptacle mounted vertically that routes all edge connector traces to the bottom surface of the test tray, again, suitable for engaging with a bed of nails-type test board.

22 Claims, 4 Drawing Sheets

INTERPOSER/CONVERTER TO ALLOW SINGLE-SIDED CONTACT TO CIRCUIT MODULES

CROSS REFERENCE TO RELATED APPLICATION

This application is a division of U.S. patent application Ser. No. 08/810,048, filed Mar. 4, 1997, now issued as U.S. Pat. No. 6,004,142.

BACKGROUND OF THE INVENTION

1. Field of the Invention

The present invention relates to an interface adapter for providing single-sided electrical contact to a circuit card bearing contact elements on two sides.

2. State of the Art

Modern personal computers are designed to be easily upgraded by swapping out old components and replacing them with newer, faster, and higher capacity parts. For example, computer memory, such as dynamic random access memory (DRAM), is upgraded by inserting single in-line memory modules (SIMMs) into preexisting sockets on a motherboard. SIMMs are small circuit cards with memory chips attached and a single-sided edge connector having a data width of 32-bits. Dual in-line memory modules (DIMMs) provide greater data widths (64- and 72-bits) and higher memory density, particularly useful for size-limited applications, such as notebook computers. DIMMs have double-sided edge connectors to maintain a small form factor with wider data widths. The trend in state-of-the-art microprocessors is also toward wider word widths. This trend is generating demand for higher performance memory components, such as DIMMs.

SIMMs and DIMMS are tested for burn-in (infant mortality) and functionality. For purposes of burn-in testing, standard SIMM and DIMM sockets can be used to test for infant mortality. Functional testing is performed on automatic test equipment, typically with a "bed of nails" type interface which was originally designed to simultaneously test a plurality of individual packaged dice. However, in the case of a SIMM cards, with its single line of edge contacts on one side of the card, such test equipment may be easily adapted to electrically connect to the contacts of SIMM card placed flat in a carrier tray, such as a JEDEC (Joint Electronic Device Engineering Council)-configured tray. In such a case, eight to ten of the SIMM cards may be tested, per tray, on a tester of the aforementioned configuration at one time.

The current generation of circuit card test trays for SIMMs are not, however, adaptable to handle the double-sided connectors of DIMMs because one-half of the edge connectors or contacts of the DIMM cards face opposite the test side of the tray by which contact is made. One possible solution is to design the DIMMs with through-hole or via-connected test pads extending from one side of the card to the other side. thus providing all edge connector contacts on one side of the card for test purposes. However, this potential solution requires greater use of limited circuit board surface area, as well as greater cost because of the additional traces and through-holes required. Moreover, the added conductive trace complexity may introduce more defects into the cards themselves, lowering yield for other than die-related failures.

Other circuit boards and cards employing double-sided connectors and presenting similar test and contact problems include (by way of example only) other multi-chip modules (MCMs) including other dice in addition to or in lieu of memory dice, as well as triple in-line memory modules (TRIMMs).

Electrical sockets for connecting SIMMs are taught by Lwee et al. (U.S. Pat. No. 5,256,078, Oct. 26, 1993, hereinafter the "'078" patent). Electrical sockets for connecting DIMMs are taught by Noschese et al. (U.S. Pat. No. 5,511,985, Apr. 30, 1996, hereinafter the "985" patent). While suitable for burn-in testing, neither the '078 patent nor the '985 patent teach a circuit card receptacle for routing edge connector traces from one side of the circuit card to the other side to facilitate testing of the card from a single side. Thus, there is a need in the art for a circuit card receptacle which allows single-sided testing of circuit cards or boards having double-sided edge connectors to avoid the necessity for investing in new and different test equipment to accommodate such dualsided connector configurations.

SUMMARY OF THE INVENTION

The invention comprises, in several embodiments, a circuit card receptacle for routing dual-sided edge connectors from any kind of multi-chip module (MCM) for effecting electrical contact from a single side of the receptacle. The invention may be combined with a test tray suitable for automatic testing of MCMs with automatic test equipment utilizing a bed of nails or other probe-type load board interface.

In the first embodiment of the invention, a U-shaped receptacle for circuit cards bearing dual-sided edge connectors or contacts is provided. The U-shaped receptacle allows direct connection of a "bed of nails" type load board to edge connectors on one side of a circuit card, termed for convenience the "test" side, and additionally provides test pads on the test side of the receptacle electrically connected to the non-test side edge connectors of the circuit card. The U-shaped receptacle is preferably pivotally mounted on a test tray for easy insertion and removal of the circuit cards and correct placement of the test pads to face the bottom of the tray.

A second embodiment of the invention also provides a circuit card receptacle pivotally mounted on a test tray. When viewed from a side elevation, the circuit card receptacle routes edge connector traces from both sides of the card to test pads on one surface of the receptacle located between the pivot point and the edge connector receptacle.

A third embodiment of the invention also provides a circuit card receptacle pivotally mounted on a test tray and, as illustrated, routes dual-sided edge connector traces to test pads on one surface of the receptacle. In this embodiment, a side elevation view reveals that the receptacle contains a pivot point located between test pads routed from edge connector traces and the edge connector receptacle.

It should be noted that the first embodiment may employ a pivot point located between the test points and the bottom or base of the "U," or a pivot point may be on the legs of the "U."

In the fourth embodiment, fixed circuit card receptacles are mounted on a test tray such that circuit cards inserted in the receptacles are perpendicular to the test tray. In this embodiment, both sets of edge connector traces of the card are routed to test pads located on the underside of the tray. This embodiment provides greater card density for testing in comparison to the others if suitable test equipment is available. Hereinafter, this embodiment is referred to as the fixed perpendicular embodiment.

An alternative means, and a fifth embodiment, for mounting the card receptacles on the test tray is the use of a quick-release mechanism for securing and removing each card receptacle from the tray. This method of mounting provides the advantages of the pivot mounting arrangements, first, by facilitating insertion and removal of circuit cards from the receptacle and, second, by allowing the receptacle with card inserted to be held co-planar with the test tray. Thus, a quick-release mechanism could be substituted for the pivot mounting mechanisms described in the first three embodiments above.

BRIEF DESCRIPTION OF THE SEVERAL VIEWS OF THE DRAWINGS

FIG. 7 is a perspective view of stackable test trays suitable for use with the receptacle embodiments illustrated in FIGS. 1, 2A, 2B, 3, 4 and 6.

DETAILED DESCRIPTION OF THE INVENTION

An understanding of the detailed description of the invention is facilitated by drawing FIGS. 1 through 7. The embodiments of the invention each solve the problem of interfacing a dual-sided circuit card to a single-sided load board used in functional testing without resorting to expensive retooling of the tester interface or purchase of different test equipment.

Figure 1:
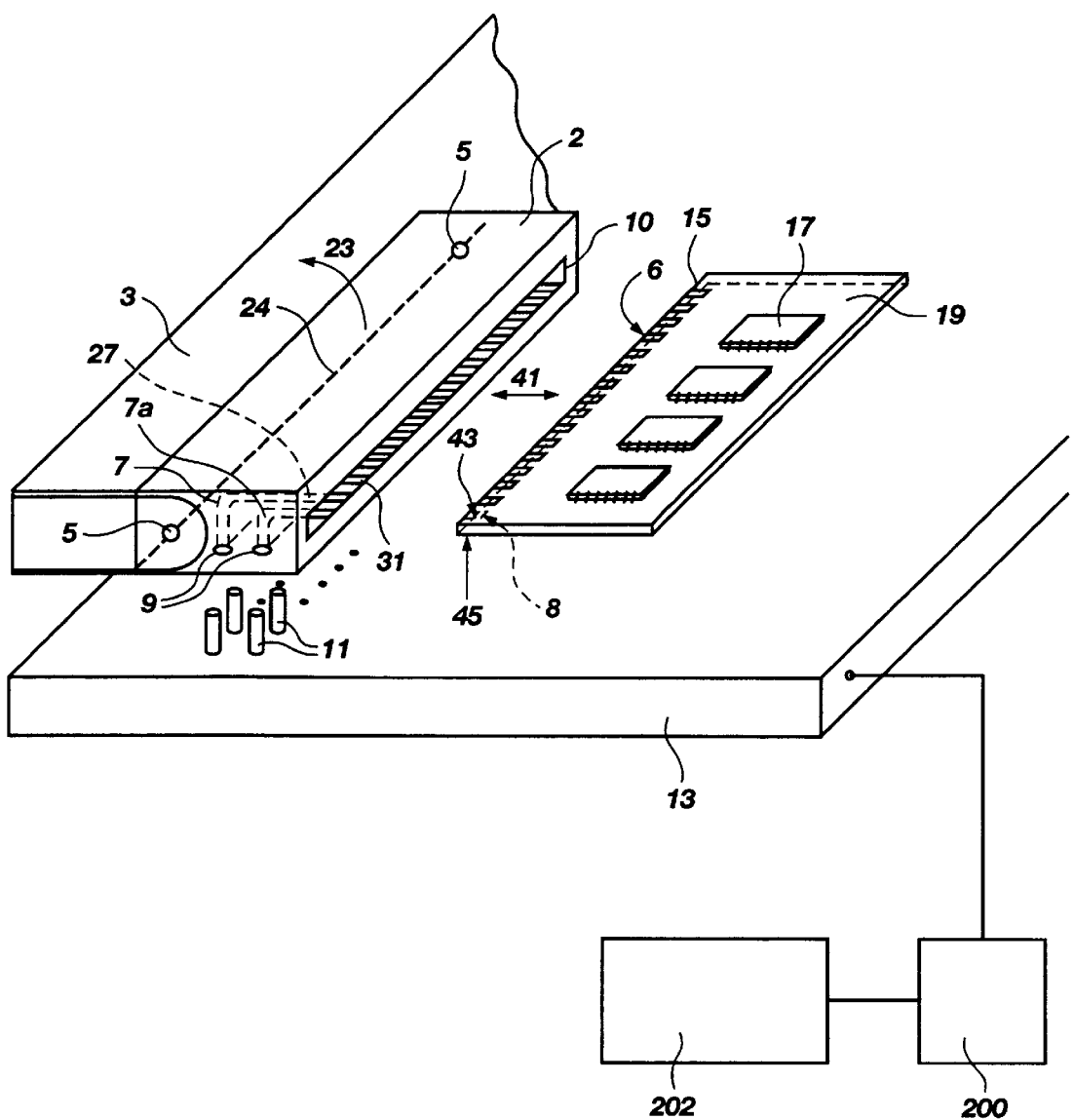
FIG. 1 is a perspective, generic view of the invention as used with a test tray and a multi-chip module to be tested.

FIG. 1 shows an exemplary, pictorial view of the invention comprising a circuit card receptacle 2 mounted on a test tray 3. The test tray 3 could be fabricated with any number of receptacles 2, limited only by tray size and the number of circuit card test pins 11 (also termed "pogo pins", "nails" or "probes") available on the load board 13. Load board 13 is connected to a test interface adapter 200, which, in turn, is connected to a functional test system 202 comprising a computer controlled by a software test program. FIG. 1 shows a representative circuit card 19 which is to be inserted 41 into the circuit card receptacle 2. The circuit card 19 has a dual-sided edge connector 15 with two rows of edge connector traces 6 and 8, one on the non-test side 43, and another (not visible in FIG. 1) on the test side 45. Mounted on the circuit card 19 are integrated circuit dice 17. The circuit card 19 engages the circuit card receptacle 2 at a socket or slot 10, which may be formed with either closed or open lateral ends, but if with open ends also providing tabs or stops proximate each end for proper lateral card location. The edge connector traces 6 of non-test side 43 of the circuit card edge connector 15 connect with mating edge contacts 27 (one shown in broken lines in FIG. 1) within the slot 10 connected to circuit traces 7 extending from within the socket or slot 10 to a first row of test pads 9 located on the test side of the circuit cad receptacle 2. Similarly, the edge connector traces 8 of test side 45 or the circuit card edge connector 15 connects with mating edge contacts 31 within the socket or slot 10 connected to circuit traces 7a extending from within the socket or slot 10 to an additional, second row of test pads 9 also located on the test side of receptacle 2. Mating edge contacts may comprise any suitable structures, such as leaf spring contacts or zero-insertion-force (ZIF) contacts. Further, circuit traces 7 and 7a are desirably routed and configured for minimal length and matched impedance. The circuit card receptacle 2 is rotatable as shown at 23 about an axis 24 extending between pivot or hinge points 5 to facilitate insertion and removal 41 of the circuit card 19 under test. The test pins or probes 11 of the load board 13 mechanically contact and electrically communicate with the test pads 9 arrayed in a mating configuration when the test tray 3 is aligned and engaged with the load board 13. The embodiments of the invention are described in further detail in FIGS. 2A through 7.

Figure 2A:
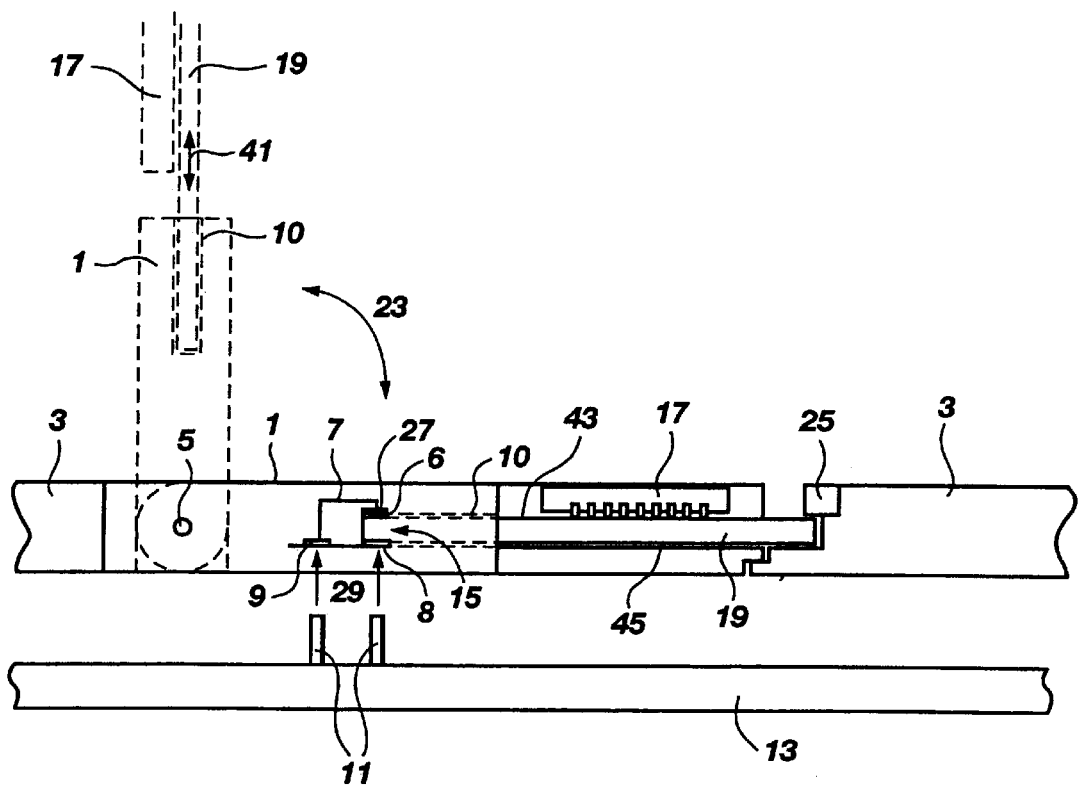
FIGS. 2A and 2B are side elevation and top views of a first embodiment of the invention employing a U-shaped, pivoting receptacle.
Figure 2B:
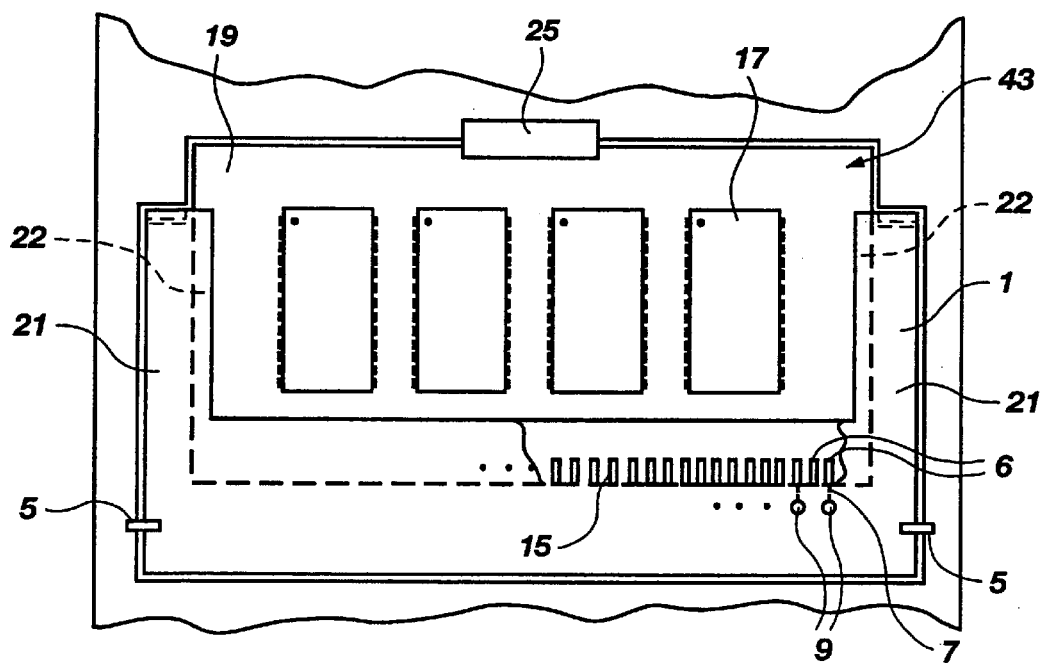
Figure 3:
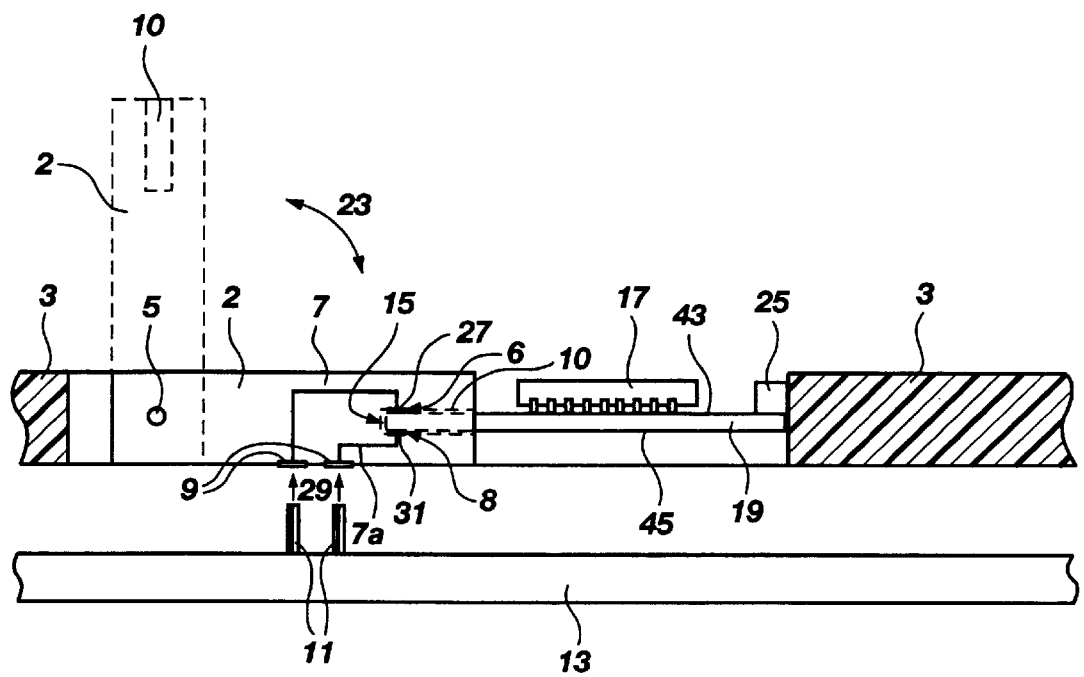
FIG. 3 is a side elevation of a second embodiment of the invention where the test pads are located between the pivot point of a pivotable circuit card receptacle and the edge connector receptacle.
Figure 4:
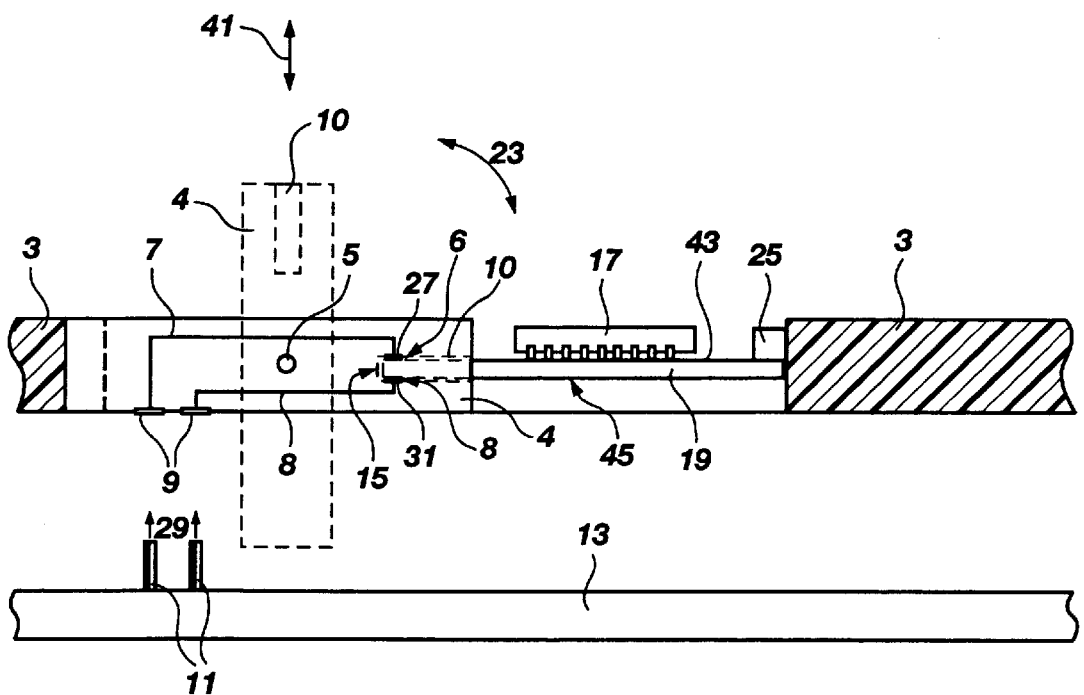
FIG. 4 is a side elevation of a third embodiment of the invention where the pivot point of a pivoting circuit card receptacle is located between the test pads and the edge connector receptacle.

FIG. 2A shows a side cross-sectional elevation of the first embodiment of the invention. A U-shaped half-socket receptacle 1 is provided to route the non-test side edge connector traces 6 on non-test side 43 of circuit card 19 to test pads 9 by circuit traces 7, using mating edge contacts 27. This embodiment further allows direct connection 29 to test side edge connector traces 8 on the circuit card 19. It should be noted that, in this embodiment, test pads 9 and test side edge connector traces 8 lie in substantially co-planar relationship parallel to the plane of test tray 3 for coequal contact with load board 13. Since only one side of circuit card 19 is connected by circuit traces 7 to test pads 9, while edge connector traces 8 make direct contact with test pins 11, it may be desirable to include components in circuit traces 7 so that impedance matching may be achieved. The half-socket receptacle 1 is pivotally mounted 5 on a test tray 3 to allow: (1) linear insertion and removal 41 of a circuit card 19 to be tested, and (2) rotation 23 of the circuit card 19 until it is co-planar with the test tray 3 and ready to interface with the "pogo" pins or nails 11 on the load board 13. FIG. 2B shows the circuit card 19 held in the half-socket receptacle 1 by slots 22 in legs 21 of the "U" engaging the lateral marginal extremities of the circuit card 19. The circuit card 19, inserted in the half-socket receptacle 1, is held co-planar within the test tray 3 by a retaining clip 25 extending or protruding from test tray 3 to engage the top of the circuit card opposite the dual-sided edge connector 15. The retaining clip 25 could be of any conventional design, such as a leaf or bow spring, a spring-loaded ball detent, or a pivoting post, and so will not be further described. This embodiment may be modified to provide test pads electrically connected to edge connector traces 6, 8 on both sides of a circuit card 19, by configuring half-socket receptacle 1, as shown in FIGS. 3 and 4 and subsequently described herein FIG. 3 is a side elevation of the second embodiment of the invention. A circuit card receptacle 2, including a slot or socket 10, is provided to route connector traces or contacts 6, 8 from both sides of the dual-sided edge connector 15 to test pads 9 on the non-test side 43 of a circuit card 19. The circuit card receptacle 2 is pivotally mounted at 5 to the test tray 3 and locates test pads 9 between the pivot point 5 and the circuit card socket or slot 10. Like the first embodiment, the circuit card receptacle 2 is pivotally mounted on a test tray 3 to facilitate insertion and removal 41 of the circuit card 19, and rotation 23 of the circuit card 19 until it is coplanar with the test tray 3 and ready to interface with the pogo pins 11 of the load board 13. The circuit card 19 is held in the circuit card receptacle 2 by socket or slot 10. The mating edge contacts 27 and 31 of socket 10 mechanically and electrically engage the connector traces 6, 8 of dual-sided edge connector 15 of the circuit card 19 and are respectively routed to test pads 9 by circuit traces 7 and 7a of circuit card receptacle 2. The circuit card is held co-planar within the test tray 3 by a retaining clip 25 of any suitable configuration, as previously discussed, at the edge of the circuit card opposite that occupied by the dual-sided edge connector 15.

FIG. 4 shows a side elevation of the third embodiment of the invention. A circuit card receptacle 4 is provided to route connector traces or contacts 6, 8 from opposing sides of the dual-sided edge connector 15 to test pads 9 on the non-test side 43 of a circuit card 19. The circuit card receptacle socket 4 is pivotally mounted at 5 to the test tray 3. The pivot point 5 is located between the test pads 9 and the circuit card slot 10 of receptacle 4. Like prior disclosed embodiments, the receptacle 4 is pivotally mounted on a test tray 3 to allow insertion and removal 41 of the circuit card 19 under test, and rotation 23 of the circuit card until it is co-planar with the test tray 3 and ready to interface with the pogo pins 11 on the load board 13. The circuit card 19 is held in the receptacle by a socket or slot 10, which mechanically and electrically engages the dual-sided edge connector 15 of the circuit card 19. The circuit card is held co-planar within the test tray by a retaining clip 25 of suitable design at the end opposite the edge connector. The advantage of this embodiment over the second embodiment is that the direction connection 29 of the pogo pins 11 against the test pads 9 tends to hold the circuit card co-planar within the test tray 3, permitting use of a much less robust retaining clip 25, or eliminating the need for same altogether. The first embodiment may be modified in a similar manner by movement of pivot or hinge points accordingly.

Figure 5:
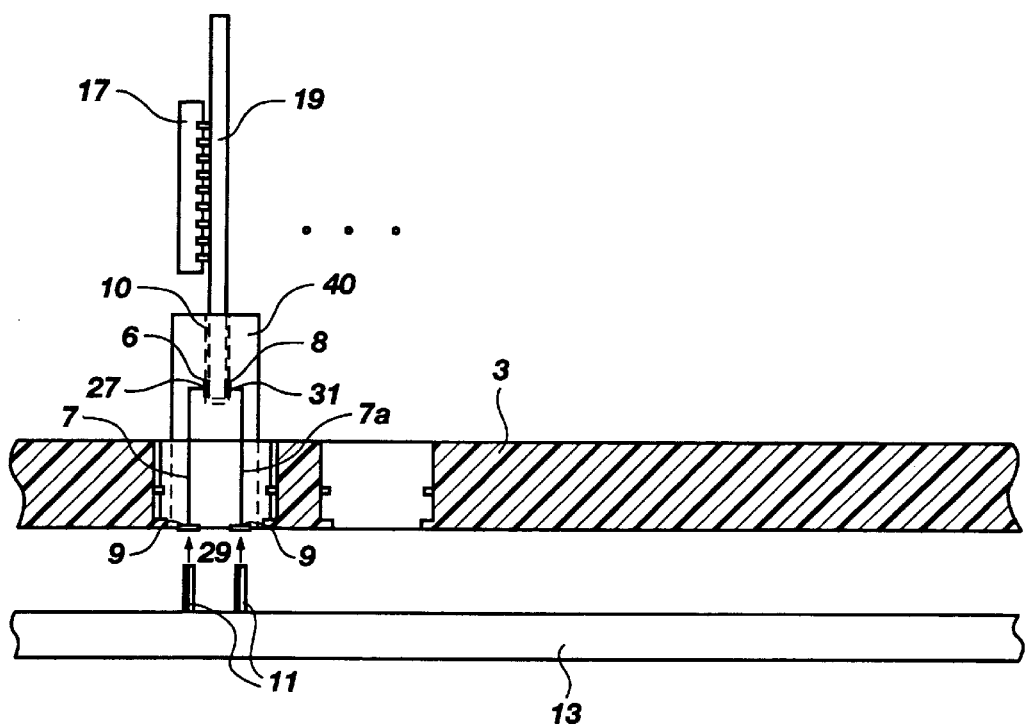
FIG. 5 is a side elevation of a fourth embodiment of the invention, also referred to as the fixed perpendicular embodiment, where the circuit card receptacles are rigidly fixed to the test tray which holds circuit cards under test perpendicular to the test tray.

A fourth embodiment of the invention, shown in FIG. 5, provides a plug-in receptacle 40 removably mounted on a test tray 3 such that each circuit card 19 under test is mounted perpendicular to the test tray 3. In this embodiment, the circuit card 19 is received in a socket or slot 10 and the plug-in receptacle 40 routes connector traces 6 and 8 by circuit traces 7 and 7a to test pads 9 on the bottom of the plug-in receptacle 40. While plug-in receptacle 40 is preferably formed separately from test tray 3 and is plugged there into in a snap-in fashion as depicted in FIG. 5, a tray with a plurality of integrally-molded plug-in receptacles 40 may be fabricated. The advantage of this embodiment is that potentially more circuit cards could be mounted on a tray. However, this embodiment does not facilitate stacking of trays with mounted circuit cards 19 ready to test because the circuit cards 19 project from the plane of the tray. In comparison, test trays incorporating the first three embodiments can be stacked easily to facilitate movement and storage of the loaded test trays in an automated production test environment. Further, the circuit density in the fixed perpendicular embodiment may require upgraded test equipment.

Figure 6:
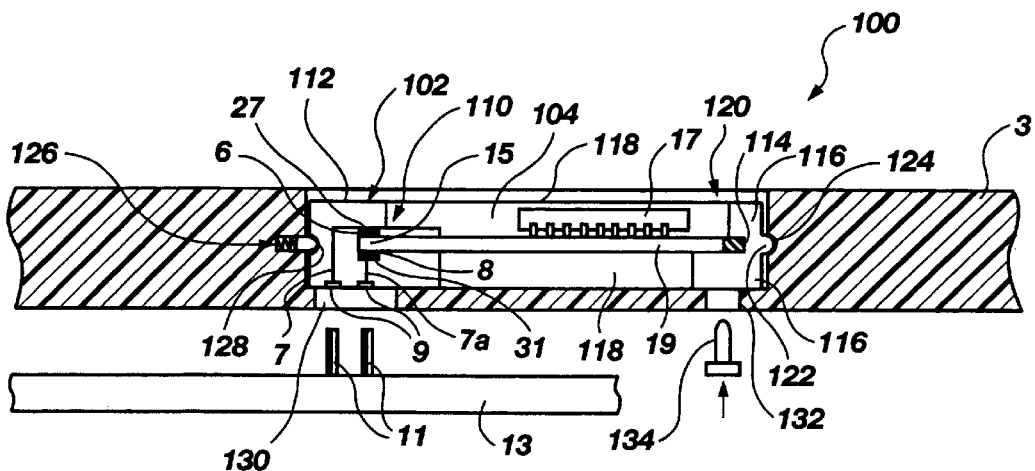
FIG. 6 is a side elevation of a fifth embodiment of the invention, wherein a quick-release mechanism employing a snap-in type receptacle is used in lieu of a pivoting receptacle.

The various pivot mounting mechanisms described above may be replaced by a quick-release mechanism, such as depicted in FIG. 6. Such a quick-release mechanism allows rapid fixing and removal of the receptacle to, in turn, facilitate insertion and removal of the circuit card to be tested. The quick-release mechanism also allows the card and receptacle combination to lie co-planar with the test tray, as with the pivoting embodiments. Once the cards and receptacles are secured, the entire tray can be interfaced with a bed of nails type load board on a functional tester. Thus, a quick-release mechanism substitutes for the pivot mount. The pivot mounting scheme is preferable only because it is integrated, whereas the quick-release scheme permits pre-loading of circuit cards in receptacles for subsequent insertion in trays. Trays using both pivoting and quick-release receptacles may be easily stacked. FIG. 7 illustrates stackable test trays 700 according to the invention. Stackable test trays 700 may include pivoting or quick-release receptacles as described above and illustrated in FIGS. 1, 2A, 2B, 3, 4 and 6.

The quick-release mechanism 100, as shown in FIG. 6, comprises a rectangular, window-frame type receptacle 102 into which a circuit card 19 may be inserted.

Receptacle 102 includes an upper window 104 in its upper surface (as depicted in FIG. 6) through which circuit card 19 may be inserted with its double-sided edge connector 15 extending into shallow slot 110 in receptacle base 112 wherein mating edge contacts 27 and 31, respectively, mechanically and electrically engage connector traces 6. 8 of double-sided edge connector 15. Mating edge contacts 27 electrically communicate through circuit traces 7 with a first set of test pads 9 on the bottom of receptacle 102, while mating edge contacts 31 communicate through circuit traces 7a with a second set of test pads 9 coplanar with the first set. Circuit card 19 is maintained in slot 110 by an elastomeric biasing pad 114 carried by receptacle header 116. Base 112 and header 116 are joined by side columns 118 (one shown) extending transversely therebetween. Biasing pad 114 needs to provide only a nominal bias to retain circuit card 19 in receptacle 102 during handling and testing, as receptacle 102, and not circuit card 19, sustains the transverse mechanical loading imposed by contact of test pins 11 with test tray 3. Receptacle 102, in turn, is secured within receptacle bay 120 of test tray 3 by engagement of linear protrusion 122 (which extends across the top of header 116) with slot 124 on one end of bay 120, while a detent 126 (shown here by way of example as a coil-spring-biased, bullet-shaped element with a hemispherical head) engages dimple or cavity 128 in receptacle base 112. Test pads 9 are exposed to test pins 11 through test aperture 130 in the bottom of receptacle bay 120 in test tray 3.

In operation, circuit card 19 is loaded into a receptacle 102, as previously discussed. Receptacle 102 is then snapped into a bay 120 in a test tray 3 (each test tray preferably having a number of such bays formed therein), each bay 120 receiving a receptacle 102 carrying a circuit card 19. A tray of circuit cards 19 is then tested on load board 13, pogo pins 11 contacting test pads 9 associated with each circuit card 19. After load testing, receptacles 102 are unloaded by pulling them out of bays 120 transverse to the plane of test tray 3, overcoming the spring bias of detent 126. The insertion and removal operation may be manual, and finger-holds (not shown) provided on receptacle 102. Further, an access window 132 may be provided in the bottom of each bay 120 so that a pin-type removal mechanism 134 may engage the headers 116 of receptacles 102 and "pop" them out of test tray 3, as shown. Receptacles 102 may also be employed for storage, handling and testing of circuit cards 19 before and after load testing for protection of circuit cards 19.

It will be understood that all of the embodiments herein should be formed of a low-static plastic or other polymers, or include an anti-static coating thereon. It will be further understood that each receptacle embodiment may be tailored for a specific card configuration (size and shape, number of contacts, contact pitch, etc.), and that such receptacles will preferably be configured on their exteriors to be interchangeable on carrier trays, in terms of interchangeability of receptacles for others of the same embodiment.

Although the present invention has been described with reference to particular embodiments, the invention is not limited to these described embodiments and additions, deletions and modifications to the disclosed embodiments, including without limitation the combination of features of different embodiments, will be apparent to those of ordinary skill in the art and lie within the scope of the claims following this specification.

What is claimed is:

1. A circuit card receptacle for adapting a semiconductor die-carrying circuit card bearing a dual-sided edge connector for single-sided electrical contact, comprising:

an elongated slot structure for receiving the dual-sided edge connector of said semiconductor die-carrying circuit card;

a mechanism for mounting the circuit card receptacle to a receptacle carrier and permitting insertion and removal of the semiconductor die-carrying circuit card to and from said receptacle carrier;

two groups of contacts mounted within said elongated slot structure, the first group configured for mating with a first side of said dual-sided circuit card edge connector and the second group configured for mating with a second opposing side of said dual-sided circuit card edge connector;

planar electrical test pads coplanar with a single surface of said circuit card receptacle configured for mechanical contact with test pins from a load board; and circuit traces carried by said circuit card receptacle connecting said two groups of contacts to said planar electrical test pads.

2. The circuit card receptacle of claim 1, wherein said tow groups of contacts are selected from a group comprising spring leaf contacts and zero-insertion force (ZIF) contacts.

3. The circuit card receptacle of claim 1, wherein said circuit traces are routed for minimal length and impedance matching.

4. The circuit card receptacle of claim 1, wherein said semiconductor die-carrying circuit card is selected from a group comprising dual in-line memory modules (DIMMs), multi-chip modules (MCMs), and triple in-line memory modules (TRIMMs).

5. The circuit card receptacle of claim 1, further comprising a load board including pin-type probes configured to contact said planar electrical test pads.

6. The circuit card receptacle of claim 1, further including a substantially planar receptacle carrier configured to engage said mechanism for mounting said circuit card receptacle to said receptacle carrier and allowing said circuit card to lie co-planar with said receptacle carrier when said circuit card receptacle is mounted thereto.

7. The circuit card receptacle of claim 6, wherein said mounting mechanism comprises a pivotal mounting mechanism.

8. The circuit card receptacle of claim 6, wherein said receptacle carrier comprises an injection-molded tray configured to hold a plurality of circuit cards inserted in receptacles.

9. The circuit card receptacle of claim 6, wherein said circuit card receptacle is pivotally mounted to said receptacle carrier, and at least some of said planar electrical test pads are located on said circuit card receptacle with an axis about which said circuit card receptacle may pivot located between said planar electrical test pads and said elongated slot structure.

10. The circuit card receptacle of claim 6, wherein said circuit card receptacle is pivotally mounted to said receptacle carrier, and at least some of said planar electrical test pads are located on said circuit card receptacle between said elongated slot structure and an axis about which said circuit card receptacle may pivot.

11. In combination, a substantially planar receptacle carrier and circuit card receptacle for adapting a semiconductor die-carrying circuit card bearing a double-sided edge connector for single-sided electrical contact, comprising.

an elongated cavity structure with two contact rows, formed on the receptacle each contact row comprising a plurality of contacts arranged for mating with one of two opposing sides of said double-sided edge connector;

a plurality of test pads on a surface of the circuit card receptacle electrically connected to said plurality of contacts in a one-to-one correspondence, said plurality test pads lying in substantially co-planar relationship; and a mechanism coupling said circuit card receptacle to said substantially planar receptacle carrier, permitting insertion and removal of said semiconductor die-carrying circuit card from said substantially planar receptacle carrier, while also allowing said semiconductor die-carrying circuit card to lie co-planar with said substantially planar receptacle carrier where said circuit card receptacle is mounted thereto.

12. The substantially planar receptacle carrier and circuit card receptacle of claim 11, wherein said coupling mechanism comprises a pivotal coupling mechanism.

13. The substantially planar receptacle carrier and circuit card receptacle of claim 11, wherein said coupling mechanism comprises a structure permitting insertion and removal of said circuit card receptacle having a circuit card inserted therein.

14. The substantially planar receptacle carrier and circuit card receptacle of claim 11, wherein said substantially planar receptacle carrier comprises a stackable test tray configured to hold a plurality of receptacles having circuit cards inserted therein, and further comprising a plurality of receptacles.

15. The substantially planar receptacle carrier and circuit card receptacle of claim 11, wherein said semiconductor die-carrying circuit card is selected from a group comprising dual in-line memory modules (DIMMs), multi-chip modules (MCMs), and triple in-line memory modules (TRIMMs).

16. The substantially planar receptacle carrier and circuit card receptacle of claim 11, further comprising a load board including pin-type probes configured to contact said plurality of test pads.

17. A circuit card receptacle for adapting a semiconductor die-carrying circuit card bearing a double-sided edge connector for single-sided electrical contact, comprising:

an elongated slot structure for receiving the double-sided edge connector of said semiconductor die-carrying circuit card;

two groups of contacts mounted within said elongated slot structure, each contact group arranged for mating with one of two opposing sides of said double-sided edge connector;

circuit traces carried by said circuit card receptacle electrically connecting said two groups of contacts to electrical test pads on a common surface of said circuit card receptacle; and a mechanism for mounting, said circuit card receptacle to a receptacle carrier extending substantially in a single plane.

18. The circuit card receptacle of claim 17, wherein said circuit card receptacle is securable to said receptacle carrier such that insertion and removal of said semiconductor die-carrying circuit card therein is perpendicular to said receptacle carrier.

19. The circuit card receptacle of claim 17, wherein said circuit card receptacle is removably securable to said receptacle carrier.

20. The circuit card receptacle of claim 17, wherein said semiconductor die-carrying circuit card is selected from a group comprising dual in-line memory modules (DIMMs), multi-chip modules (MCMs) and triple in-line memory modules (TRIMMs).

21. The circuit card receptacle of claim 17, wherein said mounting mechanism comprises a pivotal mounting mechanism.

22. The circuit card receptacle of claim 17, further including said receptacle carrier, and wherein said receptacle carrier and said circuit card receptacle are permanently secured together.

\* \* \* \* \*

UNITED STATES PATENT AND TRADEMARK OFFICE
CERTIFICATE OF CORRECTION

PATENT NO. : 6,200,144 B1
DATED : March 13, 2001
INVENTOR(S) : James M. Wark

It is certified that error appears in the above-identified patent and that said Letters Patent is hereby corrected as shown below:

Column 1,
Line 39, before "SIMM" delete "a"

Column 2,
Line 14, change "dualsided" to -- dual-sided --

Column 3,
Line 20, change the comma after "receptacle" to a semicolon
Line 51, after "of" and before "receptacles" insert -- circuit card --
Line 52, delete "circuit card"
Line 53, change ""pogo pins"," to -- "pogo pins," --

Column 4,
Line 11, before "receptacle" insert -- circuit card --
Line 57, insert a period after "herein"

Column 5,
Line 19, delete "socket"
Line 32, change "direction" to -- direct --
Line 48, change "there into" to -- thereinto --

Column 6,
Line 22, change "6. 8" to -- 6,8 --

Column 7,
Line 29, insert a comma after "second"
Line 37, change "two" to -- two --

Column 8,
Line 14, change "comprising." to -- comprising: --
Line 15, delete the comma after "rows"
Line 16, insert a comma after "receptacle"
Line 22, after "plurality" insert -- of --

UNITED STATES PATENT AND TRADEMARK OFFICE
CERTIFICATE OF CORRECTION

PATENT NO.   : 6,200,144 B1
DATED        : March 13, 2001
INVENTOR(S)  : James M. Wark It is certified that error appears in the above-identified patent and that said Letters Patent is hereby corrected as shown below:

Column 9,
Line 3, delete the comma after "mounting"

Signed and Sealed this

First Day of February, 2005

JON W. DUDAS
*Director of the United States Patent and Trademark Office*